(12) United States Patent
Anderson et al.

(10) Patent No.: US 12,557,328 B2
(45) Date of Patent: Feb. 17, 2026

(54) VERTICAL-TRANSPORT FIELD-EFFECT TRANSISTOR WITH BACKSIDE SOURCE/DRAIN CONNECTIONS

(71) Applicant: International Business Machines Corporation, Armonk, NY (US)

(72) Inventors: Brent A. Anderson, Jericho, VT (US); Albert M. Chu, Nashua, NH (US); Nicholas Anthony Lanzillo, Wynantskill, NY (US); Ruilong Xie, Niskayuna, NY (US); Lawrence A. Clevenger, Saratoga Springs, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 17/936,434

(22) Filed: Sep. 29, 2022

(65) Prior Publication Data
US 2024/0113219 A1   Apr. 4, 2024

(51) Int. Cl.
| | | |
|---|---|---|
| H10D 30/63 | (2025.01) | |
| H01L 23/528 | (2006.01) | |
| H01L 23/535 | (2006.01) | |
| H10D 64/23 | (2025.01) | |
| H10D 84/85 | (2025.01) | |

(52) U.S. Cl.
CPC ......... *H10D 30/63* (2025.01); *H01L 23/5283* (2013.01); *H01L 23/5286* (2013.01); *H01L 23/535* (2013.01); *H10D 64/252* (2025.01); *H10D 64/254* (2025.01); *H10D 84/85* (2025.01)

(58) Field of Classification Search
CPC .. H10D 30/024; H10D 30/62; H10D 84/0193; H10D 84/853; H10D 30/025; H10D 30/63; H10D 30/6728; H10D 84/85; H10D 64/252; H10D 84/016; H01L 23/5286
See application file for complete search history.

(56) References Cited

U.S. PATENT DOCUMENTS 6,495,454 B2    12/2002  Livengood
9,799,655 B1*   10/2017  Cheng ................ H10D 30/6728
(Continued)

FOREIGN PATENT DOCUMENTS

CN    120019730 A    5/2025
EP     3324436 B1    8/2020
(Continued)

OTHER PUBLICATIONS

International Searching Authority, "The Written Opinion of the International Searching Authority", International application No. PCT/IB2023/058606, International Filing Date Aug. 31, 2023, Mailed on Dec. 15, 2023, 18 pages.
(Continued)

*Primary Examiner* — Maliheh Malek
(74) *Attorney, Agent, or Firm* — Edward J. Wixted, III

(57) ABSTRACT

A VTFET is provided on a wafer. A backside power delivery network is on a backside of the wafer. A first backside contact is connected to a bottom source/drain region of the VTFET and a first portion of the backside power delivery network. A second backside contact is connected to top source/drain region of the VTFET and a second portion of the backside power delivery network.

19 Claims, 11 Drawing Sheets

(56) References Cited

U.S. PATENT DOCUMENTS

| | | | |
|---|---|---|---|
| 10,079,230 B2 | 9/2018 | Stuber | |
| 11,081,484 B2* | 8/2021 | Zhu | H10D 88/01 |
| 11,270,991 B1 | 3/2022 | Chava | |
| 11,521,927 B2* | 12/2022 | Xie | H01L 21/30604 |
| 12,051,699 B2 | 7/2024 | Zhang | H10D 84/853 |
| 2002/0076884 A1* | 6/2002 | Weis | H10B 12/0383 |
| | | | 257/334 |
| 2008/0135932 A1 | 6/2008 | Ozeki | |
| 2009/0152611 A1* | 6/2009 | Fujimoto | H01L 21/6835 |
| | | | 438/269 |
| 2011/0068387 A1 | 3/2011 | Kitamura | |
| 2012/0292777 A1 | 11/2012 | Lotz | |
| 2015/0155286 A1* | 6/2015 | Chuang | H10B 10/12 |
| | | | 438/268 |
| 2019/0326165 A1* | 10/2019 | Xie | H10D 30/025 |
| 2020/0144260 A1 | 5/2020 | Do | |
| 2020/0381300 A1 | 12/2020 | Zhang | |
| 2021/0074823 A1* | 3/2021 | Glass | H10D 48/30 |
| 2021/0082902 A1 | 3/2021 | Sobue | |
| 2021/0242202 A1 | 8/2021 | Do | |
| 2022/0068805 A1 | 3/2022 | Lee | |
| 2023/0411290 A1* | 12/2023 | Xie | H10D 30/6757 |
| 2024/0079461 A1* | 3/2024 | Anderson | H10D 30/63 |
| 2024/0105727 A1* | 3/2024 | Miao | H10D 84/0195 |
| 2024/0105841 A1* | 3/2024 | Anderson | H10D 64/252 |
| 2024/0113021 A1* | 4/2024 | Anderson | H01L 23/5286 |
| 2024/0145311 A1* | 5/2024 | Xie | H10D 30/63 |
| 2024/0204100 A1* | 6/2024 | Xie | H10D 86/431 |

FOREIGN PATENT DOCUMENTS

| | | |
|---|---|---|
| WO | 2021080673 A1 | 4/2021 |
| WO | 2024/069277 A1 | 4/2024 |

OTHER PUBLICATIONS

Jagannathan et al. "Vertical-Transport Nanosheet Technology for CMOS Scaling beyond Lateral-Transport Devices", 2021 IEEE International Electron Devices Meeting (IEDM), Dec. 2021, 4 pages.

* cited by examiner

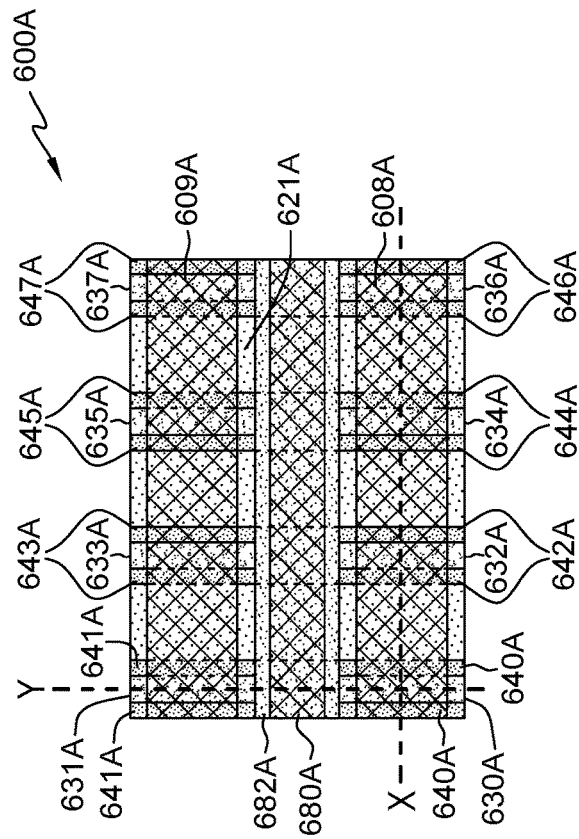
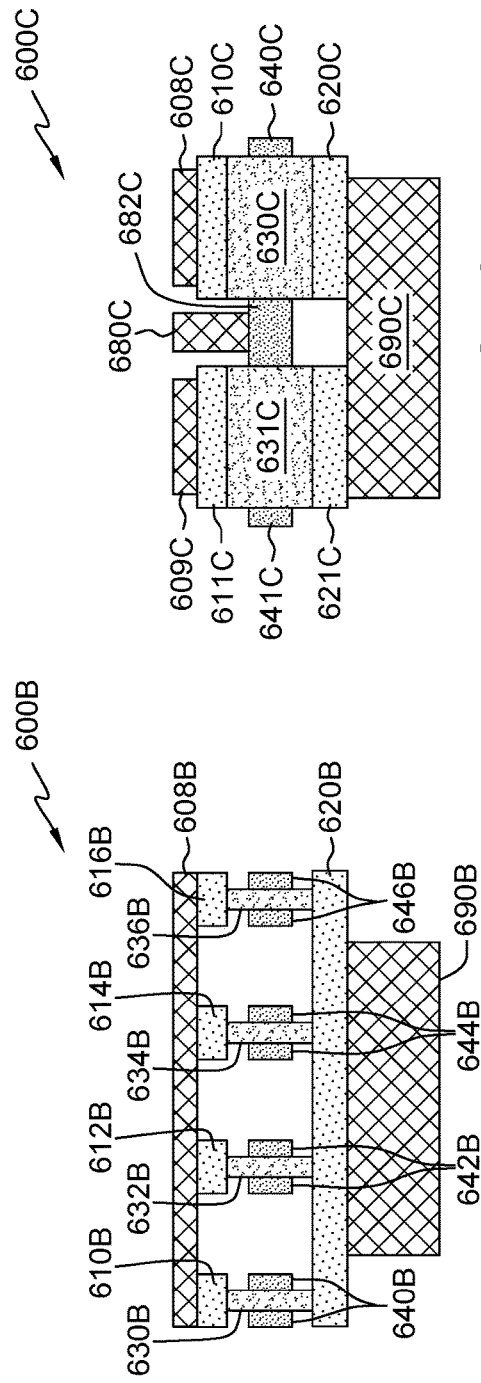
FIG. 6A
FIG. 6B
FIG. 6C

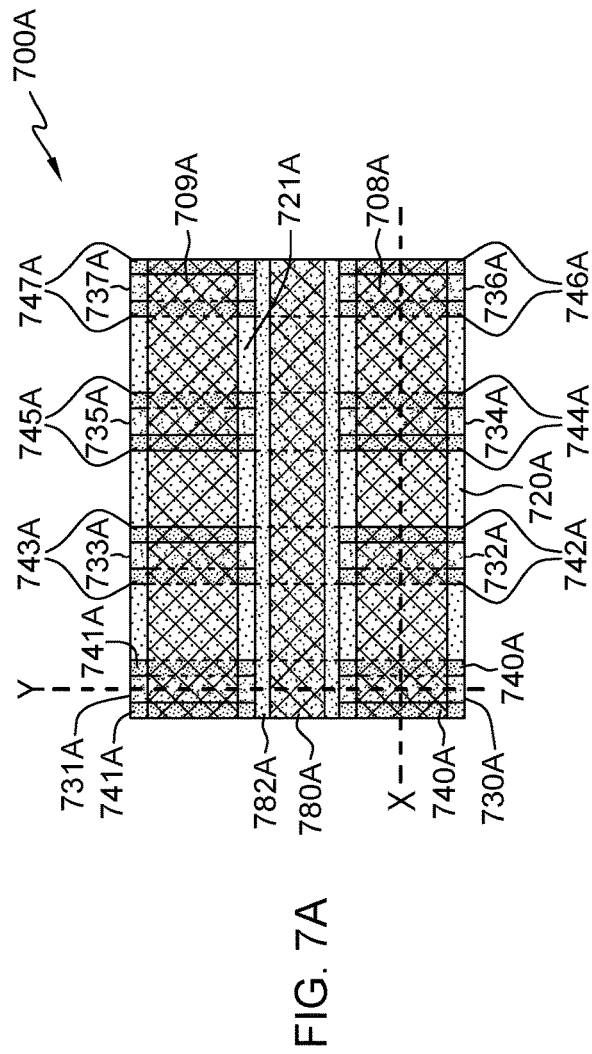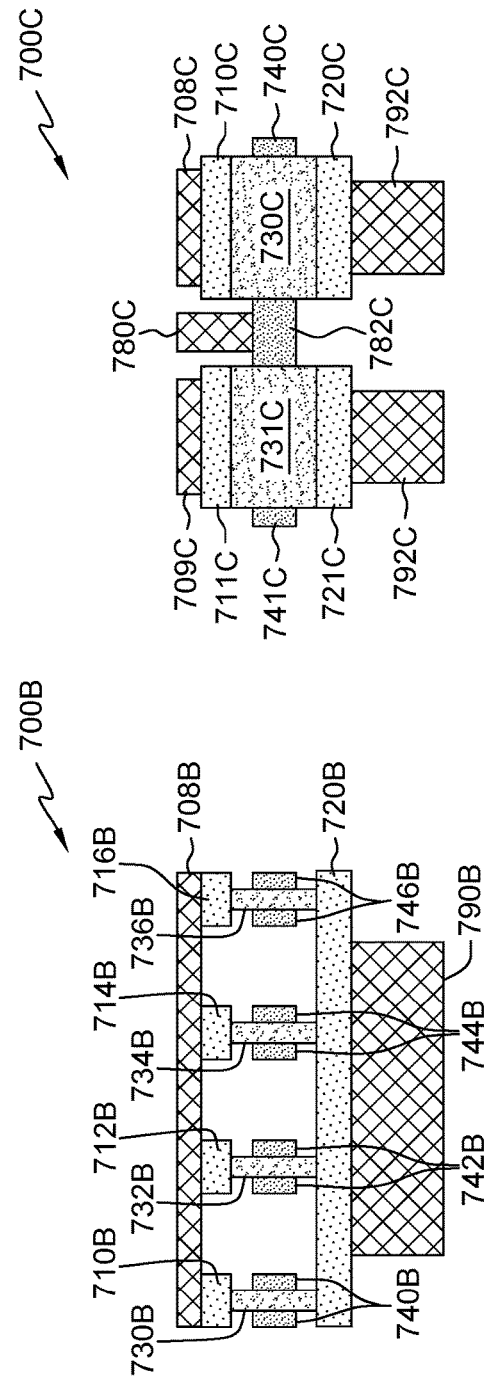
FIG. 7A
FIG. 7B
FIG. 7C

VERTICAL-TRANSPORT FIELD-EFFECT TRANSISTOR WITH BACKSIDE SOURCE/DRAIN CONNECTIONS

BACKGROUND OF THE INVENTION

The present invention relates generally to the field of semiconductor device manufacture and more particularly to a vertical-transport field-effect transistors (VTFET) with both a top source/drain region and a bottom source/drain region connected to a backside power delivery network.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

VTFET devices allow for the flow of current vertically, from a bottom source/drain region to a top source/drain region. In a VTFET device, a bottom source/drain region is located closest to the wafer, a gate region is on top of the bottom source/drain region and a top source/drain region is on top of the gate region. The bottom source/drain region is located closest to the wafer the circuit is formed upon and the top source/drain region is located farthest from the wafer the circuit is formed upon. Thus, there is a need to contact the backside power delivery network by the top source/drain region.

SUMMARY

In a first embodiment, a vertical-transport field-effect transistor (VTFET) is provided on a wafer. In the first embodiment, a backside power delivery network is on a backside of the wafer. In the first embodiment, a first backside contact is connected to a bottom source/drain region of the VTFET and a first portion of the backside power delivery network. In the first embodiment, a second backside contact is connected to top source/drain region of the VTFET and a second portion of the backside power delivery network.

In the first embodiment, the VTFET has a first width, and wherein the first width is a contacted poly pitch (CPP). In the first embodiment, the second backside contact is at least the first width from the VTFET. In the first embodiment, the second backside contact is double the first width from the VTFET. In the first embodiment, the backside power delivery network is selected from the group consisting of clock, power, or output signal.

Embodiments of the present invention provide increased size backside contacts to top source/drain regions for increased resistance. Embodiments of the present invention provide for high drive and low resistance paths from devices to backside power distribution networks. Embodiments of the present invention provide for increased area efficiency by utilizing a single CPP for multiple connections. Embodiments of the present invention provide for any number of signals (e.g., clock, buss, I/O, power, ground, etc.) to be distributed or delivered to source/drain/gate regions of VTFET through a backside power delivery network.

In a second embodiment, a plurality of vertical-transport field-effect transistor (VTFET) on a wafer. In the second embodiment, a backside power delivery network on a backside of the wafer. In the second embodiment, a first backside contact is connected to a bottom source/drain region of each VTFET of the plurality of VTFET and a first portion of the backside power delivery network. In the second embodiment, a second backside contact is connected to a top source/drain region of each VTFET of the plurality of VTFET and a second portion of the backside power delivery network.

In the second embodiment, VTFET of the plurality of VTFET has a first width, and wherein the first width is a contacted poly pitch (CPP). In the second embodiment, the second backside contact is at least the first width from a first VTFET of the plurality of VTFET. In the second embodiment, the second backside contact is double the first width from a first VTFET of the plurality of VTFET. In the second embodiment, the first backside contact is connected to an active area layer. In the second embodiment, the backside power delivery network is selected from the group consisting of clock, power, or output signal. In the second embodiment, the height of the second backside contact is a height of a VTFET cell of the plurality of VTFET.

Embodiments of the present invention provide for strapping NFET and PFET devices with full cell height contacts. Embodiments of the present invention provide for a solution that avoids an RX, or active area, layer in the frontside to backside connection for lower resistance. Embodiments of the present invention provide for any number of signals (e.g., clock, buss, I/O, power, ground, etc.) to be distributed or delivered to source/drain/gate regions of VTFET through a backside power delivery network.

In a third embodiment, a first plurality of VTFET are in a first row on a wafer. In the third embodiment, a second plurality of VTFET are in a second row on the wafer and the first row is vertically adjacent to the second row. In the third embodiment, a first shared backside contact is connected to a top source/drain region of each VTFET of the first plurality of VTFET. In the third embodiment, a second shared backside contact is connected to a top source/drain region of each VTFET of the second plurality of VTFET. In the third embodiment, a second backside contact is connected the first shared backside contact, the second shared backside contact and the backside power delivery network. In the third embodiment, the backside power delivery network on a backside of the wafer.

In the third embodiment, a first shared bottom contact connected a bottom source/drain region of each VTFET of the first plurality of VTFET. In the third embodiment, a second shared bottom contact connected a bottom source/drain region of each VTFET of the second plurality of VTFET. In the third embodiment, the first shared bottom contact is connected to a first portion of the backside power delivery network and wherein the second shared bottom contact is connected to a second portion of the backside power delivery network.

In the third embodiment, a shared bottom contact connected a bottom source/drain region of each VTFET of the first plurality of VTFET and a bottom source/drain region of each VTFET of the second plurality of VTFET. In the third embodiment, the shared bottom contact is connected the backside power delivery network In the third embodiment, each VTFET of the first plurality of VTFET and the second plurality of VTFET has a first width, and wherein the first width is a contacted poly pitch (CPP). In the third embodiment, the second backside contact may be at least the first width from a first VTFET of the plurality of first plurality of VTFET. In the third embodiment, the second backside contact is double the first width from a first VTFET of the first plurality of VTFET. In the third embodiment, the backside power delivery network is selected from the group consisting of clock, power, or output signal.

Embodiments of the present invention provide increased size backside contacts to top source/drain regions for increased resistance. Embodiments of the present invention provide for high drive and low resistance paths from devices to backside power distribution networks. Embodiments of the present invention provide for increased area efficiency by utilizing a single CPP for multiple connections. Embodiments of the present invention provide for strapping NFET and PFET devices with full cell height contacts. Embodiments of the present invention provide for a solution that avoids an RX, or active area, layer in the frontside to backside connection for lower resistance. Embodiments of the present invention provide for any number of signals (e.g., clock, buss, I/O, power, ground, etc.) to be distributed or delivered to source/drain/gate regions of VTFET through a backside power delivery network.

BRIEF DESCRIPTION OF THE DRAWINGS

The above and other aspects, features, and advantages of various embodiments of the present invention will be more apparent from the following description taken in conjunction with the accompanying drawings.

FIG. 6A depicts a top view of the semiconductor structure depicting two sets of four VTFET in parallel in accordance with a first embodiment of the present invention.

FIG. 6B depicts a cross-sectional view of section X of FIG. 6A of the semiconductor structure depicting two sets of four VTFET in parallel in accordance with a first embodiment of the present invention.

FIG. 6C depicts a cross-sectional view of section Y of FIG. 6A of the semiconductor structure depicting two sets of four VTFET in parallel in accordance with a first embodiment of the present invention.

FIG. 7A depicts a top view of the semiconductor structure depicting two sets of four VTFET in parallel in accordance with a second embodiment of the present invention.

FIG. 7B depicts a cross-sectional view of section X of FIG. 7A of the semiconductor structure depicting two sets of four VTFET in parallel in accordance with a second embodiment of the present invention.

FIG. 7C depicts a cross-sectional view of section Y of FIG. 7A of the semiconductor structure depicting two sets of four VTFET in parallel in accordance with a second embodiment of the present invention.

DETAILED DESCRIPTION

Figure 1:
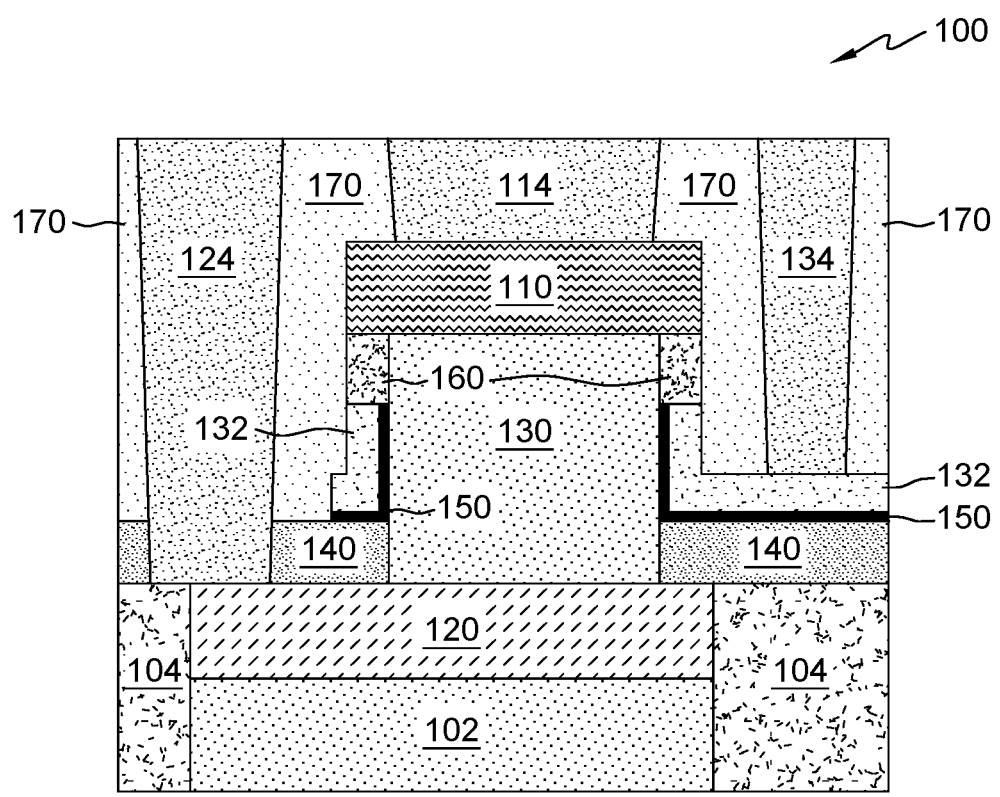
FIG. 1 depicts a cross-section view of a VTFET semiconductor structure with a frontside contact for the top source/drain region, bottom source/drain region, and gate region, in accordance with a first embodiment of the present invention.

Embodiments of the present invention recognize that vertical-transport field-effect transistors (VTFET) have vertical current flow. Embodiments of the present invention recognize that VTFET include a bottom source/drain region and a top source/drain region. Embodiments of the present invention recognize that the bottom source/drain region is closer to the backside of the VTFET (closer to the wafer) and that the top source/drain region is closer to the frontside of the VTFET (closer to the traditional interconnect wiring). Embodiments of the present invention recognize that an input will be to one source/drain region and the output will be to one source/drain region and therefore one of either the input or the output will be on the backside of the device and one of either the input or the output will be on the frontside of the device. Therefore, embodiments of the present invention recognize there is a need for a top source/drain on the front of the VTFET to reach the backside of the semiconductor device. Embodiments of the present invention recognize that in conventional VTFETs, the pitch (or width) between gates in adjacent devices in the same semiconductor layer is commonly known as a contacted gate pitch (CGP) or a contact poly pitch (CPP).

Embodiments of the present invention provide increased size backside contacts to top source/drain regions for increased resistance. Embodiments of the present invention provide for high drive and low resistance paths from devices to backside power distribution networks. Embodiments of the present invention provide for increased area efficiency by utilizing a single CPP for multiple connections. Embodiments of the present invention provide for strapping NFET and PFET devices with full cell height contacts. Embodiments of the present invention provide for a solution that avoids an RX, or active area, layer in the frontside to backside connection for lower resistance. Embodiments of the present invention provide for any number of signals (e.g., clock, buss, I/O, power, ground, etc.) to be distributed or delivered to source/drain/gate regions of VTFET through a backside power delivery network.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein. Reference will now be made in detail to the embodiments of the present invention, examples of which are illustrated in the accompanying drawings, wherein like reference numerals refer to like elements throughout.

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. It is to be understood that aspects of the present invention will be described in terms of a given illustrative architecture; however, other architectures, structures, substrate materials, process features and steps can be varied within the scope of aspects of the present invention.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, and only so much of the commonly practiced process steps are included as are necessary for an understanding of the described embodiments. The figures represent cross-section portions of a portion of an advanced semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("ME"). In general, ME uses chemically reactive plasma to remove material deposited on wafers. High-energy ions from the ME plasma attack the wafer surface and react with the surface material(s) to remove the surface material(s).

Deposition processes for the metal liners and sacrificial materials include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Vertical transport field-effect transistors (VTFETs) have become viable device options for scaling semiconductor devices (e.g., complementary metal oxide semiconductor (CMOS) devices) to 5 nanometer (nm) node and beyond. VTFET devices include one or more fin channels with source/drain regions at ends of the fin channels on the top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FiN-FET-equivalent density at a larger contacted poly pitch (CPP), and providing lower middle-of-line (MOL) resistance.

Figure 2:
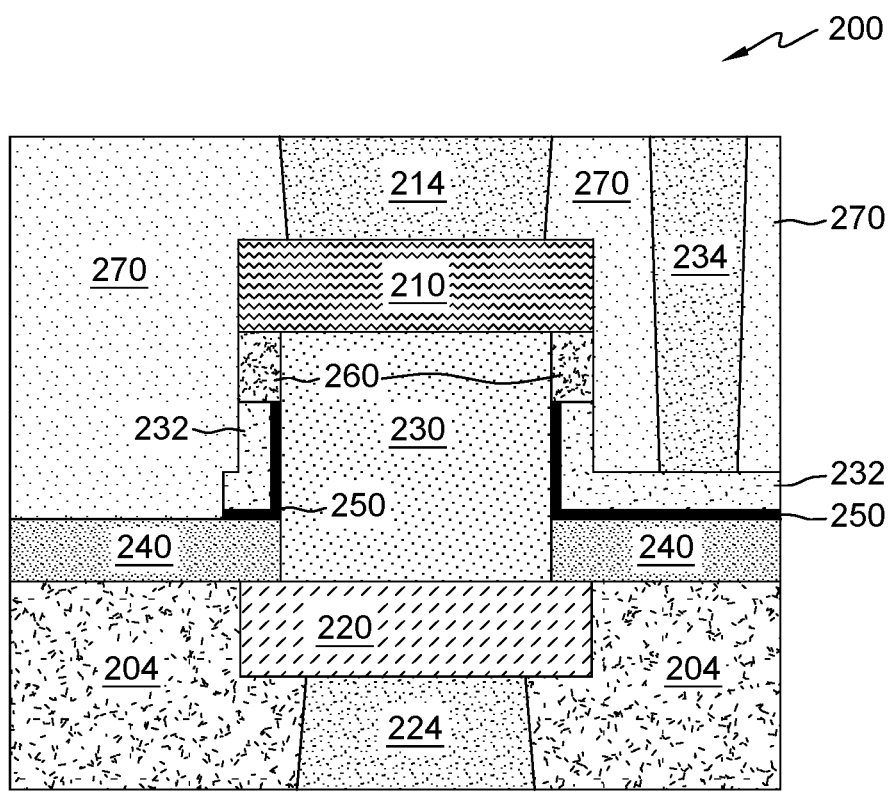
FIG. 2 depicts a cross-section view of a VTFET semiconductor structure with a frontside contact for the top source/drain region and gate region and a backside contact for the bottom source/drain region, in accordance with a first embodiment of the present invention.
Figure 3:
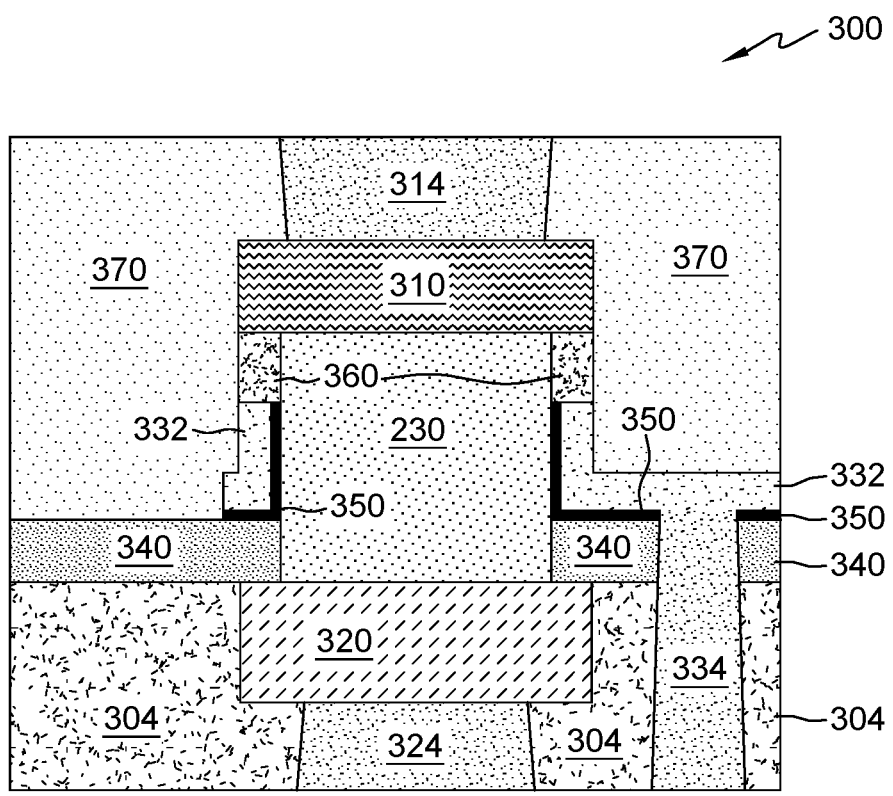
FIG. 3 depicts a cross-section view of a VTFET semiconductor structure with a frontside contact for the top source/drain and a backside contact for the bottom source/drain region and gate region, in accordance with a first embodiment of the present invention.

In a first embodiment, FIG. 1 shows a VTFET 100 with contact 114, contact 124, and contact 134 connected directly to interconnect wiring and/or a power delivery network (not shown) on the frontside of VTFET 100. In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300.

FIG. 1 is a cross-sectional view of a VTFET 100 formed on a bulk substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

VTFET 100 includes STI region 104 comprised of a dielectric material such as silicon oxide or silicon oxynitride, and is formed by methods known in the art. For example, in one illustrative embodiment, STI region 104 is a shallow trench isolation oxide layer.

VTFET 100 includes top source/drain region 110 and bottom source/drain region 120 on either end of fin 130. In an embodiment, top source/drain region 110 is formed between dielectric layer 170. In an embodiment, bottom source/drain region 120 is formed in substrate 102 between shallow trench isolation region 104. Top source/drain region 110 and bottom source/drain region 120 are formed by, for example, epitaxial growth processes. The epitaxially grown top source/drain region 110 and bottom source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the bottom source/drain region 120 can be boron doped SiGe for a p-type field-effect transistor (P-FET) or phosphorous doped silicon for an n-type field-effect transistor (N-FET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used. After epi formation, drive-in anneals can be applied to move the dopants closer to the bottom of the fin channels.

In an embodiment, as used herein, a "semiconductor fin" or fin 130 refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each fin 130 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each fin 130 is spaced apart from its nearest neighboring fin 130 by a pitch ranging from approximately 20 nm to approximately 100 nm; the pitch is measured from one point, or reference surface, of one semiconductor fin to the exact same point, or reference surface, on a neighboring semiconductor fin. Also, the fins 130 are generally oriented parallel to each other. Although the present application describes and illustrates a single fin 108, any number of fins with gate region surrounding them may be used and the fins may be any shape.

The fin 130 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, fin 130 is silicon.

In an embodiment, bottom spacer layer 140 is formed on the STI region 104 and bottom source/drain region 120. In an embodiment, bottom spacer layer 140 is formed around fin 130. Suitable material for bottom spacer layer 140 includes, for example, silicon boron nitride (SiBN), siliconborocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the bottom spacer layer 140 can be formed by overfilling the space with dielectric materials, followed by chemical mechanical planarization (CMP) and dielectric recess.

In an embodiment, top spacer layer 160 is formed on the gate region between fin 130 and dielectric layer 170. In an embodiment, top spacer layer 160 is formed around fin 130. Suitable material for top spacer layer 160 includes, for example, silicon boron nitride (SiBN), siliconborocarbonitride (SiBCN), silicon oxycarbonitride (SiOCN), SiN and $SiO_x$. Bottom spacer layer 140 can be deposited using, for example, directional deposition techniques, such as a high-density plasma (HDP) deposition and gas cluster ion beam (GCIB) deposition. The directional deposition deposits the spacer material preferably on the exposed horizontal surfaces, but not on the lateral sidewalls. Alternatively, the top spacer layer 160 can be formed by overfilling the space with dielectric materials, followed by chemical mechanical planarization (CMP) and dielectric recess.

A gate region is formed on bottom spacer layer 140 and around fin 130. In illustrative embodiments, gate region is deposited on bottom spacer layer 140 and around fin 130 employing, for example, ALD, CVD, RFCVD, plasma enhanced CVD (PECVD), physical vapor deposition (PVD), or molecular layer deposition (MLD). The gate region may include a gate dielectric layer 150 and a gate conductor layer 132. The gate dielectric layer 150 may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate conductor layer 132 may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer 132 as desired.

In an embodiment, dielectric layer 170 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide. In an embodiment, the dielectric layer 170 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering.

In an embodiment, top source/drain region 110, bottom source drain region 120 and gate region are connected to interconnect wiring and/or a power delivery network (not shown) through contact 114, contact 124, and contact 134, respectively. In an embodiment, as shown in FIG. 1, contact 114, contact 124, and contact 134 to are formed to directly connect to interconnect wiring and/or a power delivery network (not shown) on the frontside of the VTFET 100. In an embodiment, contact 114, contact 124, and contact 134 may include any suitable conductive material, such as, for example, copper, aluminum, tungsten, cobalt, or alloys thereof. Examples of deposition techniques that can be used include, for example, chemical vapor deposition (CVD), plasma enhanced chemical vapor deposition (PECVD), or atomic layer deposition (ALD). In some cases, an electroplating technique can be used to form contact 114, contact 124, and contact 134.

In a second embodiment, FIG. 2 shows a VTFET 200 with contact 214 and contact 234 connected directly to interconnect wiring and/or a power delivery network (not shown) on the frontside of VTFET 200 and a contact 224 connected directly to interconnect wiring and/or a power delivery network (not shown) on the backside of VTFET 200. In the second embodiment, VTFET 200 shares substantially similar features to the features described above in reference to VTFET 100. For example, top source/drain region 210 is substantially similar to top source/drain region 110. It should be noted, while a substrate, similar to substrate 102 shown in FIG. 1, is not shown in FIG. 2, it would be known to one skilled in the art that VTFET 200 would be formed on a substrate similar to substrate 102 shown in FIG. 1.

In the second embodiment, the orientation of contacts in VTFET 200 are the primary differences as compared to VTFET 100. In the second embodiment, contact 214 and contact 234 are connected directly to interconnect wiring and/or a power delivery network (not shown) on the frontside of VTFET 200 and a contact 224 connected directly to interconnect wiring and/or a power delivery network (not shown) on the backside of VTFET 200.

In a third embodiment, FIG. 3 shows a VTFET 300 with contact 314 connected directly to interconnect wiring and/or a power delivery network (not shown) on the frontside of VTFET 300 and contact 324 and contact 334 connected directly to interconnect wiring and/or a power delivery network (not shown) on the backside of VTFET 300. In the third embodiment, VTFET 300 shares substantially similar features to the features described above in reference to VTFET 100 and VTFET 200. For example, top source/drain region 310 is substantially similar to top source/drain region 110 and top source/drain region 210. It should be noted, while a substrate, similar to substrate 102 shown in FIG. 1, is not shown in FIG. 3, it would be known to one skilled in the art that VTFET 300 would be formed on a substrate similar to substrate 102 shown in FIG. 1.

In the third embodiment, the orientation of contacts in VTFET 300 are the are the primary differences as compared to VTFET 100 and VTFET 200. In the third embodiment, contact 314 is connected directly to interconnect wiring and/or a power delivery network (not shown) on the frontside of VTFET 300 and contact 324 and contact 334 are connected directly to interconnect wiring and/or a power delivery network (not shown) on the backside of VTFET 300.

Figure 4A:
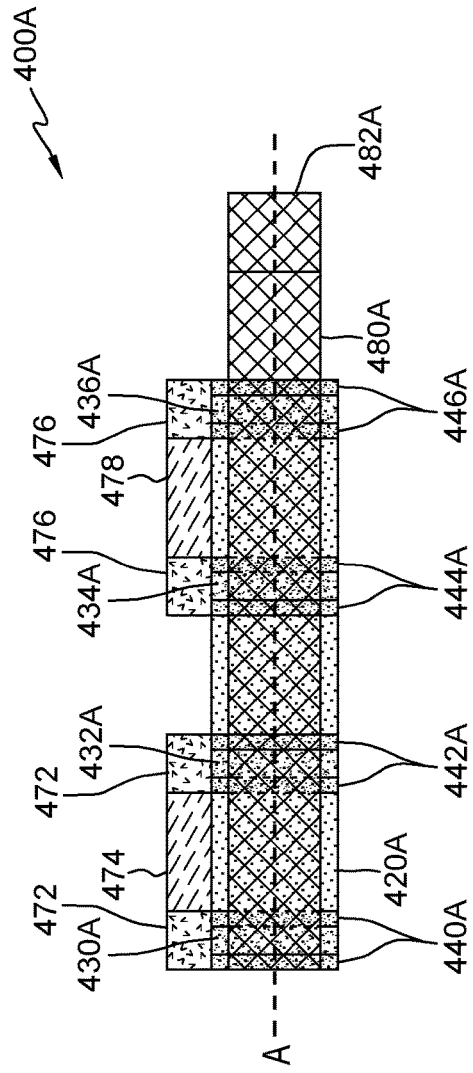
FIG. 4A depicts a top view of the semiconductor structure including four VTFET in parallel in accordance with a first embodiment of the present invention.

FIG. 4A depicts a top view of the semiconductor structure 400A including four VTFET in parallel in accordance with a first embodiment of the present invention. In other words, a shared input is provided to the first VTFET, second VTFET, third VTFET, and fourth VTFET and a shared output extends from the first VTFET, second VTFET, third VTFET, and fourth VTFET. In this embodiment, the bottom source/drain region is the input and the top source/drain region is the output. In an alternative embodiment, the bottom source/drain region is the output and the top source/drain region in the input. As shown in FIG. 4A, the first VTFET includes a shared bottom source/drain region 420A, a fin 430A, and a top source/drain region (not shown). As shown in FIG. 4A, the second VTFET includes a shared bottom source/drain region 420A, a fin 432A, and a top source/drain region (not shown). As shown in FIG. 4A, the third VTFET includes a shared bottom source/drain region 420A, a fin 434A, and a top source/drain region (not shown). As shown in FIG. 4A, the fourth VTFET includes a shared bottom source/drain region 420A, a fin 436A, and a top source/drain region (not shown). As described, the top source/drain region for each VTFET is not shown for simplicity of the drawings. It should be noted, in a preferred embodiment, the shared bottom source/drain region 420A may be connected to a backside power delivery network (not shown). In an alternative embodiment, the shared bottom source/drain region 420A may be connected to a frontside power delivery network (not shown). In an embodiment, shared bottom source/drain region 420A may be any number of separate bottom source/drain regions connected by a shared bottom contact, discussed in FIG. 4B, which connects to a frontside or backside power delivery network (not shown). In an embodiment, the first VTFET, second VTFET, third VTFET, and fourth VTFET each have a top source/drain region (not shown) that is connected to a shared frontside contact 480A. In an embodiment, the shared frontside contact 480A is connected to a backside contact 482A. In an embodiment, backside contact 482 is connected to a backside power delivery network (not shown). In an embodiment, as shown here, shared frontside contact 480A extends to a left edge of gate region 440A. In alternative embodiments, as known in the art, shared frontside contact 480A may extend any horizontal distance as long as shared frontside contact 480A is at least electrically connected to the top source/drain region(s), described below.

As shown in FIG. 4A, in an embodiment, the first VTFET includes a gate region 440A surrounding at least a portion of the fin 430A. In an embodiment, the second VTFET includes a gate region 442A surrounding at least a portion of the fin 432A. In an embodiment, semiconductor structure 400A includes a shared gate region 472 connected to both the gate region 440A and gate region 442A. In an embodiment, shared gate region 472 is connected to gate contact 474 and gate contact 474 is connected to a frontside or backside power delivery network (not shown). In an alternative embodiment, shared gate region 472 may not exist, and both gate region 440A and gate region 442A may have their own gate contact (not shown) that are connected to a frontside or backside power delivery network (not shown). In an embodiment, the third VTFET includes a gate region 444A surrounding at least a portion of the fin 434A. In an embodiment, the fourth VTFET includes a gate region 446A surrounding at least a portion of the fin 436A. In an embodiment, semiconductor structure 400A includes a shared gate region 476 connected to both the gate region 444A and gate region 446A. In an embodiment, shared gate region 476 is connected to gate contact 478 and gate contact 478 is connected to a frontside or backside power delivery network (not shown). In an alternative embodiment, shared gate region 476 may not exist, and both gate region 444A and gate region 446A may have their own gate contact (not shown) that are connected to a frontside or backside power delivery network (not shown). In another alternative embodiment, a single shared gate contact (not shown) may be connected to gate region 440A, 442A, 444A, and 446A and the single shared gate contact (not shown) is connected to a frontside or backside power delivery network (not shown).

Figure 4B:
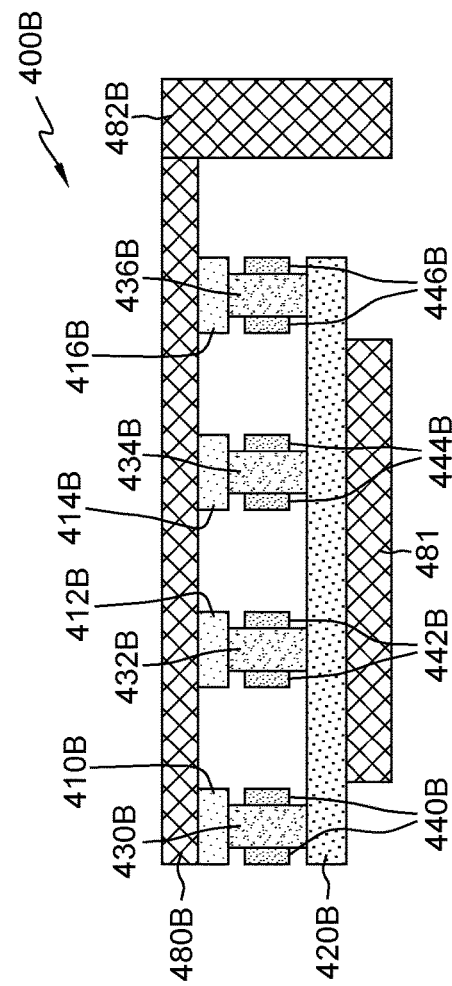
FIG. 4B depicts a cross-sectional view of section A of the semiconductor structure including four VTFET in parallel in accordance with a first embodiment of the present invention.

FIG. 4B depicts a cross-sectional view of section A of the semiconductor structure 400B including four VTFET in parallel in accordance with a first embodiment of the present invention. As shown in FIG. 4B, the first VTFET includes a shared bottom source/drain region 420B, a fin 430B, a top source/drain region 410B, and a gate region 440B surrounding a portion of fin 430B. As shown in FIG. 4B, the second VTFET includes a shared bottom source/drain region 420B, a fin 432B, a top source/drain region 412B, and a gate region 442B surrounding a portion of fin 432B. As shown in FIG. 4B, the third VTFET includes a shared bottom source/drain region 420B, a fin 434B, a top source/drain region 414B, and a gate region 444B surrounding a portion of fin 434B. As shown in FIG. 4B, the fourth VTFET includes a shared bottom source/drain region 420B, a fin 436B, a top source/drain region 416B, and a gate region 446B surrounding a portion of fin 436B. It should be noted, in alternative embodiments, each VTFET, or any combination of VTFET, may have individual/separate bottom source/drain regions connected to a backside contact 481. In an embodiment, the shared bottom source/drain region 420B is connected to backside contact 481 and backside contact 481 may be connected to a backside power delivery network (not shown). In an embodiment, top source/drain region 410B, 412B, 414B, and 416B are connected to shared frontside contact 480B. In an embodiment, shared frontside contact 480B is connected to backside contact 482B. In an embodiment, backside contact 482B is connected to a backside power delivery network contact 486 and backside power delivery network contact 486 is connected to a backside power delivery network (not shown). In an alternative embodiment, backside contact 482B and backside power delivery network contact 486 may be a single metal contact or any number of metal layers.

Figure 5A:
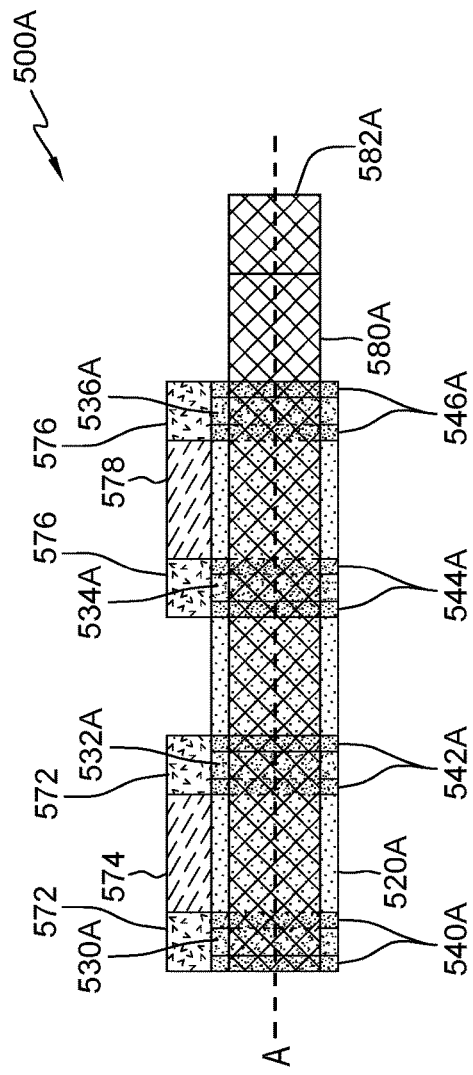
FIG. 5A depicts a top view of the semiconductor structure including four VTFET in parallel in accordance with a second embodiment of the present invention.

FIG. 5A depicts a top view of the semiconductor structure 500A including four VTFET in parallel in accordance with a second embodiment of the present invention. In other words, a shared input is provided to the first VTFET, second VTFET, third VTFET, and fourth VTFET and a shared output extends from the first VTFET, second VTFET, third VTFET, and fourth VTFET. In this embodiment, the bottom source/drain region is the input and the top source/drain region is the output. In an alternative embodiment, the bottom source/drain region is the output and the top source/drain region in the input. As shown in FIG. 5A, the first VTFET includes a shared bottom source/drain region 520A, a fin 530A, and a top source/drain region (not shown). As shown in FIG. 5A, the second VTFET includes a shared bottom source/drain region 520A, a fin 532A, and a top source/drain region (not shown). As shown in FIG. 5A, the third VTFET includes a shared bottom source/drain region 520A, a fin 534A, and a top source/drain region (not shown). As shown in FIG. 5A, the fourth VTFET includes a shared bottom source/drain region 520A, a fin 536A, and a top source/drain region (not shown). As described, the top source/drain region for each VTFET is not shown for simplicity of the drawings. It should be noted, in a preferred embodiment, the shared bottom source/drain region 520A may be connected to a backside power delivery network (not shown). In an alternative embodiment, the shared bottom source/drain region 520A may be connected to a frontside power delivery network (not shown). In an embodiment, shared bottom source/drain region 520A may be any number of separate bottom source/drain regions connected by a shared bottom contact, discussed in FIG. 5B, which connects to a frontside or backside power delivery network (not shown). In an embodiment, the first VTFET, second VTFET, third VTFET, and fourth VTFET each have a top source/drain region (not shown) that is connected to a shared frontside contact 580A. In an embodiment, the shared frontside contact 580A is connected to a backside contact 582A. In an embodiment, backside contact 582 is connected to a backside power delivery network (not shown). In an embodiment, as shown here, shared frontside contact 580A extends to a left edge of gate region 540A. In alternative embodiments, as known in the art, shared frontside contact 480A may extend any horizontal distance as long as shared frontside contact 580A is at least electrically connected to the top source/drain region(s), described below.

As shown in FIG. 5A, in an embodiment, the first VTFET includes a gate region 540A surrounding at least a portion of the fin 530A. In an embodiment, the second VTFET includes a gate region 542A surrounding at least a portion of the fin 532A. In an embodiment, semiconductor structure 500A includes a shared gate region 572 connected to both the gate region 540A and gate region 542A. In an embodiment, shared gate region 572 is connected to gate contact 574 and gate contact 574 is connected to a frontside or backside power delivery network (not shown). In an alternative embodiment, shared gate region 572 may not exist, and both gate region 540A and gate region 542A may have their own gate contact (not shown) that are connected to a frontside or backside power delivery network (not shown). In an embodiment, the third VTFET includes a gate region 544A surrounding at least a portion of the fin 534A. In an embodiment, the fourth VTFET includes a gate region 546A surrounding at least a portion of the fin 536A. In an embodiment, semiconductor structure 500A includes a shared gate region 576 connected to both the gate region 544A and gate region 546A. In an embodiment, shared gate region 576 is connected to gate contact 578 and gate contact 578 is connected to a frontside or backside power delivery network (not shown). In an alternative embodiment, shared gate region 576 may not exist, and both gate region 544A and gate region 546A may have their own gate contact (not shown) that are connected to a frontside or backside power delivery network (not shown). In another alternative embodiment, a single shared gate contact (not shown) may be connected to gate region 540A, 542A, 544A, and 546A and the single shared gate contact (not shown) is connected to a frontside or backside power delivery network (not shown).

Figure 5B:
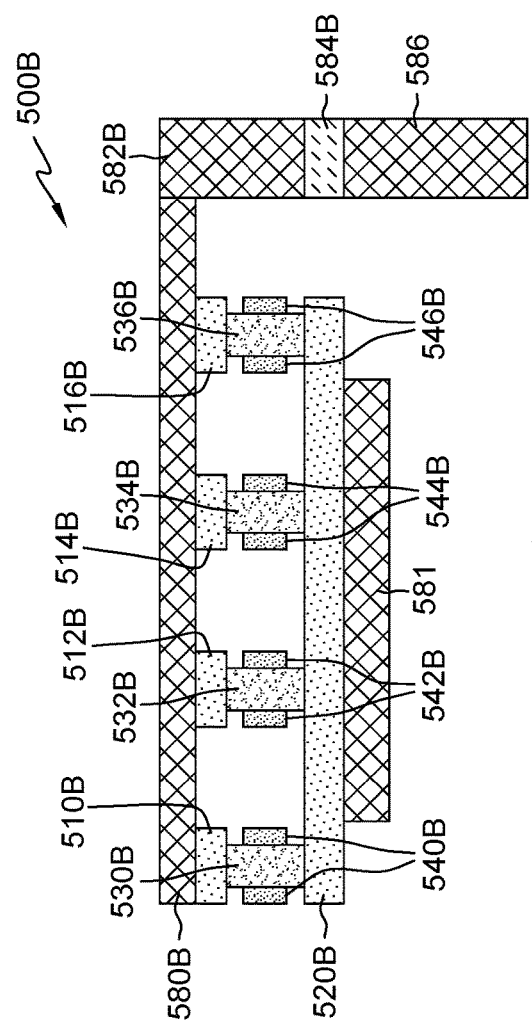
FIG. 5B depicts a cross-sectional view of section B of the semiconductor structure including four VTFET in parallel in accordance with a second embodiment of the present invention.

FIG. 5B depicts a cross-sectional view of section B of the semiconductor structure 500B including four VTFET in parallel in accordance with a second embodiment of the present invention. As shown in FIG. 5B, the first VTFET includes a shared bottom source/drain region 520B, a fin 530B, a top source/drain region 510B, and a gate region 540B surrounding a portion of fin 530B. As shown in FIG. 5B, the second VTFET includes a shared bottom source/drain region 520B, a fin 532B, a top source/drain region 512B, and a gate region 542B surrounding a portion of fin 532B. As shown in FIG. 5B, the third VTFET includes a shared bottom source/drain region 520B, a fin 534B, a top source/drain region 514B, and a gate region 544B surrounding a portion of fin 534B. As shown in FIG. 5B, the fourth VTFET includes a shared bottom source/drain region 520B, a fin 536B, a top source/drain region 516B, and a gate region 546B surrounding a portion of fin 536B. It should be noted, in alternative embodiments, each VTFET, or any combination of VTFET, may have individual/separate bottom source/drain regions connected to a backside contact 581. In an embodiment, the shared bottom source/drain region 520B is connected to backside contact 581 and backside contact 581 may be connected to a backside power delivery network (not shown). In an embodiment, top source/drain region 510B, 512B, 514B, and 516B are connected to shared frontside contact 580B. In an embodiment, shared frontside contact 580B is connected to backside contact 582B. In an embodiment, backside contact 482B is connected to an RX layer 584B. In an embodiment, RX layer 584B may be connected to any number of other devices (not shown). In an embodiment, RX layer 584B is connected to backside power delivery network contact 586 and backside power delivery network contact 586 is connected to a backside power delivery network (not shown).

FIG. 6A depicts a top view of the semiconductor structure 600A depicting two sets of four VTFET in parallel in accordance with a first embodiment of the present invention. In other words, a shared input is provided to the first VTFET, second VTFET, third VTFET, and fourth VTFET and a shared output extends from the first VTFET, second VTFET, third VTFET, and fourth VTFET. Additionally, a shared input is provided to the fifth VTFET, sixth VTFET, seventh VTFET, and eighth VTFET and a shared output extends from the fifth VTFET, sixth VTFET, seventh VTFET, and eighth VTFET. In this embodiment, the bottom source/drain region is the output and the top source/drain region is the input. In an alternative embodiment, the bottom source/drain region is the input and the top source/drain region in the output.

As shown in FIG. 6A, the first VTFET includes a shared bottom source/drain region 620A, a fin 630A, and a top source/drain region (not shown). As shown in FIG. 6A, the second VTFET includes a shared bottom source/drain region 620A, a fin 632A, and a top source/drain region (not shown). As shown in FIG. 6A, the third VTFET includes a shared bottom source/drain region 620A, a fin 634A, and a top source/drain region (not shown). As shown in FIG. 6A, the fourth VTFET includes a shared bottom source/drain region 620A, a fin 636A, and a top source/drain region (not shown). As described, the top source/drain region for each VTFET is not shown for simplicity of the drawings. It should be noted, in a preferred embodiment, the shared bottom source/drain region 620A is be connected to a backside power delivery network (not shown) discussed in FIGS. 6B and 6C. In an embodiment, shared bottom source/drain region 620A may be any number of separate bottom source/drain regions connected by a shared bottom source/drain contact which connects to a backside power delivery network (not shown). In an embodiment, the first VTFET, second VTFET, third VTFET, and fourth VTFET each have a top source/drain region (not shown) that is electrically connected to a shared frontside contact 608A.

As shown in FIG. 6A, the fifth VTFET includes a shared bottom source/drain region 621A, a fin 631A, and a top source/drain region (not shown). As shown in FIG. 6A, the sixth VTFET includes a shared bottom source/drain region 621A, a fin 633A, and a top source/drain region (not shown). As shown in FIG. 6A, the seventh VTFET includes a shared bottom source/drain region 621A, a fin 635A, and a top source/drain region (not shown). As shown in FIG. 6A, the eighth VTFET includes a shared bottom source/drain region 621A, a fin 637A, and a top source/drain region (not shown). As described, the top source/drain region for each VTFET is not shown for simplicity of the drawings. It should be noted, in a preferred embodiment, the shared bottom source/drain region 621A is be connected to a backside power delivery network (not shown) discussed in FIGS. 6B and 6C. In an embodiment, shared bottom source/drain region 620A may be any number of separate bottom source/drain regions connected by a shared bottom contact which connects to a backside power delivery network (not shown). In an embodiment, the first VTFET, second VTFET, third VTFET, and fourth VTFET each have a top source/drain region (not shown) that is electrically connected to a shared frontside contact 609A.

As shown in FIG. 6A, in an embodiment, the first VTFET includes a gate region 640A surrounding at least a portion of the fin 630A. In an embodiment, the second VTFET includes a gate region 642A surrounding at least a portion of the fin 632A. In an embodiment, the third VTFET includes a gate region 644A surrounding at least a portion of the fin 634A. In an embodiment, the fourth VTFET includes a gate region 646A surrounding at least a portion of the fin 636A. In an embodiment, the fifth VTFET includes a gate region 641A surrounding at least a portion of the fin 631A. In an embodiment, the sixth VTFET includes a gate region 643A surrounding at least a portion of the fin 633A. In an embodiment, the seventh VTFET includes a gate region 645A surrounding at least a portion of the fin 635A. In an embodiment, the eighth VTFET includes a gate region 647A surrounding at least a portion of the fin 637A.

In an embodiment, semiconductor structure 600A includes a shared gate region 682A connected to gate region 640A, 641A, 642A, 643A, 644A, 645A, 646A, and 647A. In an embodiment, shared gate region 682A is connected to gate contact 680A. In an embodiment, gate contact 680A is connected to a frontside or backside power delivery network (not shown).

FIG. 6B depicts a cross-sectional view of section X of FIG. 6A of the semiconductor structure 600B depicting two sets of four VTFET in parallel in accordance with a first embodiment of the present invention. As shown in FIG. 6B, the first VTFET includes a shared bottom source/drain region 620B, a fin 630B, a top source/drain region 610B, and a gate region 640B surrounding a portion of fin 630B. As shown in FIG. 6B, the second VTFET includes a shared bottom source/drain region 620B, a fin 632B, a top source/drain region 612B, and a gate region 642B surrounding a portion of fin 632B. As shown in FIG. 6B, the third VTFET includes a shared bottom source/drain region 620B, a fin 634B, a top source/drain region 614B, and a gate region 644B surrounding a portion of fin 634B. As shown in FIG. 6B, the fourth VTFET includes a shared bottom source/drain region 620B, a fin 636B, a top source/drain region 616B, and a gate region 646B surrounding a portion of fin 636B. In an embodiment, the shared bottom source/drain region 620B is connected to backside contact 690B and backside contact 690B may be connected to a backside power delivery network (not shown). It should be noted, in alternative embodiments, each VTFET, or any combination of VTFET, may have individual/separate bottom source/drain regions connected with the backside contact 690B. In an embodiment, top source/drain regions 610B, 612B, 614B, and 616B are connected to frontside contact 608B and frontside contact 608B may be connected to a frontside or backside power delivery network (not shown).

FIG. 6C depicts a cross-sectional view of section Y of FIG. 6A of the semiconductor structure 600C depicting two sets of four VTFET in parallel in accordance with a first embodiment of the present invention. As shown in FIG. 6C, the first VTFET includes a shared bottom source/drain region 620C, a fin 630C, a top source/drain region 610C, and a gate region 640C surrounding a portion of fin 630C. As shown in FIG. 6C, the fifth VTFET includes a shared bottom source/drain region 610C, a fin 631C, a top source/drain region 611C, and a gate region 641C surrounding a portion of fin 631C. In an embodiment, gate region 640C and gate region 641C are connected to shared gate region 682A. In an embodiment, shared gate region 682C is connected to gate contact 680C. In an embodiment, gate contact 680C is connected to a frontside or backside power delivery network (not shown). In an embodiment, the shared bottom source/drain region 620C and the shared bottom source/drain region 621C are connected to backside contact 690C and backside contact 690C may be connected to a backside power delivery network (not shown). In an embodiment, the top source/drain region 611C is connected to frontside contact 609C. In an embodiment, the top source/drain region 610C is connected to frontside contact 608C.

FIG. 7A depicts a top view of the semiconductor structure 700A depicting two sets of four VTFET in parallel in accordance with a second embodiment of the present invention. In other words, a shared input is provided to the first VTFET, second VTFET, third VTFET, and fourth VTFET and a shared output extends from the first VTFET, second VTFET, third VTFET, and fourth VTFET. Additionally, a shared input is provided to the fifth VTFET, sixth VTFET, seventh VTFET, and eighth VTFET and a shared output extends from the fifth VTFET, sixth VTFET, seventh VTFET, and eighth VTFET. In this embodiment, the bottom source/drain region is the output and the top source/drain region is the input. In an alternative embodiment, the bottom source/drain region is the input and the top source/drain region in the output.

As shown in FIG. 7A, the first VTFET includes a shared bottom source/drain region 720A, a fin 730A, and a top source/drain region (not shown). As shown in FIG. 7A, the second VTFET includes a shared bottom source/drain region 720A, a fin 732A, and a top source/drain region (not shown). As shown in FIG. 7A, the third VTFET includes a shared bottom source/drain region 720A, a fin 734A, and a top source/drain region (not shown). As shown in FIG. 7A, the fourth VTFET includes a shared bottom source/drain region 720A, a fin 736A, and a top source/drain region (not shown). As described, the top source/drain region for each VTFET is not shown for simplicity of the drawings. It should be noted, in a preferred embodiment, the shared bottom source/drain region 720A is be connected to a backside power delivery network (not shown) discussed in FIGS. 7B and 7C. In an embodiment, shared bottom source/drain region 720A may be any number of separate bottom source/drain regions connected by a shared bottom contact which connects to a backside power delivery network (not shown). In an embodiment, the first VTFET, second VTFET, third VTFET, and fourth VTFET each have a top source/drain region (not shown) that is electrically connected to a shared frontside contact 708A.

As shown in FIG. 7A, the fifth VTFET includes a shared bottom source/drain region 721A, a fin 731A, and a top source/drain region (not shown). As shown in FIG. 7A, the sixth VTFET includes a shared bottom source/drain region 721A, a fin 733A, and a top source/drain region (not shown). As shown in FIG. 7A, the seventh VTFET includes a shared bottom source/drain region 721A, a fin 735A, and a top source/drain region (not shown). As shown in FIG. 7A, the eighth VTFET includes a shared bottom source/drain region 721A, a fin 737A, and a top source/drain region (not shown). As described, the top source/drain region for each VTFET is not shown for simplicity of the drawings. It should be noted, in a preferred embodiment, the shared bottom source/drain region 721A is be connected to a backside power delivery network (not shown) discussed in FIGS. 7B and 7C. In an embodiment, shared bottom source/drain region 720A may be any number of separate bottom source/drain regions connected by a shared bottom contact which connects to a backside power delivery network (not shown). In an embodiment, the fifth VTFET, sixth VTFET, seventh VTFET, and eighth VTFET each have a top source/drain region (not shown) that is electrically connected to a shared frontside contact 709A.

As shown in FIG. 7A, in an embodiment, the first VTFET includes a gate region 740A surrounding at least a portion of the fin 730A. In an embodiment, the second VTFET includes a gate region 742A surrounding at least a portion of the fin 732A. In an embodiment, the third VTFET includes a gate region 744A surrounding at least a portion of the fin 734A. In an embodiment, the fourth VTFET includes a gate region 746A surrounding at least a portion of the fin 736A. In an embodiment, the fifth VTFET includes a gate region 741A surrounding at least a portion of the fin 731A. In an embodiment, the sixth VTFET includes a gate region 743A surrounding at least a portion of the fin 733A. In an embodiment, the seventh VTFET includes a gate region 745A surrounding at least a portion of the fin 735A. In an embodiment, the eighth VTFET includes a gate region 747A surrounding at least a portion of the fin 737A.

In an embodiment, semiconductor structure 700A includes a shared gate region 782A connected to gate region 740A, 741A, 742A, 743A, 744A, 745A, 746A, and 747A. In an embodiment, shared gate region 782A is connected to gate contact 780A. In an embodiment, gate contact 780A is connected to a frontside or backside power delivery network (not shown).

FIG. 7B depicts a cross-sectional view of section X of FIG. 7A of the semiconductor structure 700B depicting two sets of four VTFET in parallel in accordance with a second embodiment of the present invention. As shown in FIG. 7B, the first VTFET includes a shared bottom source/drain region 720B, a fin 730B, a top source/drain region 710B, and a gate region 740B surrounding a portion of fin 730B. As shown in FIG. 7B, the second VTFET includes a shared bottom source/drain region 720B, a fin 732B, a top source/drain region 712B, and a gate region 742B surrounding a portion of fin 732B. As shown in FIG. 7B, the third VTFET includes a shared bottom source/drain region 720B, a fin 734B, a top source/drain region 714B, and a gate region 744B surrounding a portion of fin 734B. As shown in FIG. 7B, the fourth VTFET includes a shared bottom source/drain region 720B, a fin 736B, a top source/drain region 716B, and a gate region 746B surrounding a portion of fin 736B. In an embodiment, the shared bottom source/drain region 720B is connected to backside contact 790B and backside contact 790B may be connected to a backside power delivery network (not shown). It should be noted, in alternative embodiments, each VTFET, or any combination of VTFET, may have individual/separate bottom source/drain regions connected with the backside contact 790B. In an embodiment, top source/drain regions 710B, 712B, 714B, and 716B are connected to frontside contact 708B and frontside contact 708B may be connected to a frontside or backside power delivery network (not shown).

FIG. 7C depicts a cross-sectional view of section Y of FIG. 7A of the semiconductor structure 700C depicting two sets of four VTFET in parallel in accordance with a second embodiment of the present invention. As shown in FIG. 7C, the first VTFET includes a shared bottom source/drain region 720C, a fin 730C, a top source/drain region 710C, and a gate region 740C surrounding a portion of fin 730C. As shown in FIG. 7C, the fifth VTFET includes a shared bottom source/drain region 710C, a fin 731C, a top source/drain region 711C, and a gate region 741C surrounding a portion of fin 731C. In an embodiment, gate region 740C and gate region 741C are connected to shared gate region 782A. In an embodiment, shared gate region 782C is connected to gate contact 780C. In an embodiment, gate contact 780C is connected to a frontside or backside power delivery network (not shown). In an embodiment, the shared bottom source/drain region 720C and is connected to backside contact 790C and backside contact 790C may be connected to a backside power delivery network (not shown). In an embodiment, the shared bottom source/drain region 721C is connected to backside contact 792C and backside contact 792C may be connected to a backside power delivery network (not shown). In an embodiment, the top source/drain region 711C is connected to frontside contact 709C. In an embodiment, the top source/drain region 710C is connected to frontside contact 708C.

Figure 8:
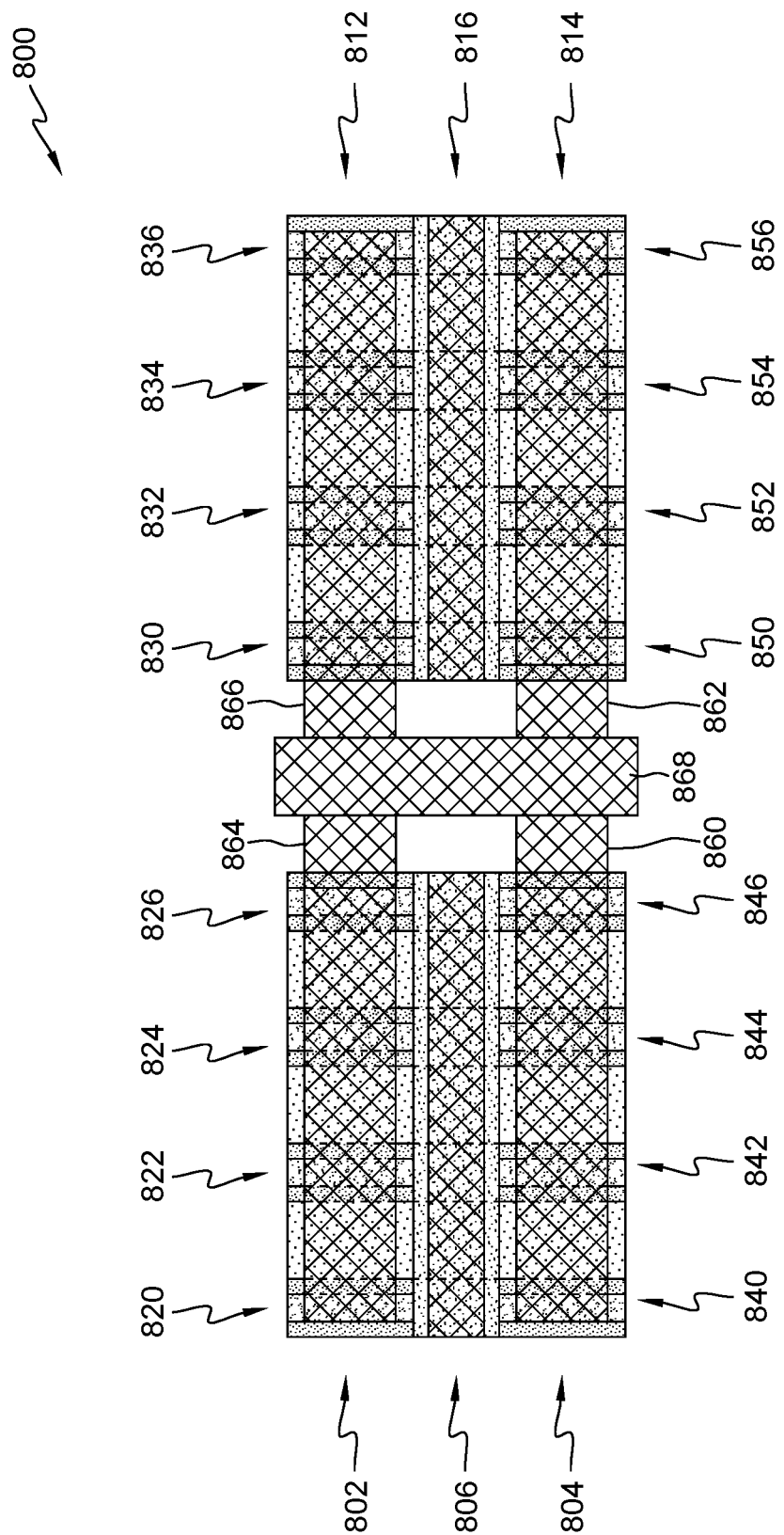
FIG. 8 depicts a top view of the semiconductor structure with a shared output region for multiple rows of semiconductor structures in accordance with a first embodiment of the present invention.

FIG. 8 depicts a top view of the semiconductor structure 800 with a shared output region for multiple rows of semiconductor structures 800 in accordance with a first embodiment of the present invention. As shown in FIG. 8, in an embodiment, semiconductor structure 800 includes a first row 802 of VTFET 820, 822, 824, and 826 in parallel. In an embodiment, semiconductor structure 800 includes a second row 812 of VTFET 830, 832, 834, and 836 in parallel. In an embodiment, semiconductor structure 800 includes a third row 804 of VTFET 840, 842, 844, and 846 in parallel. In an embodiment, semiconductor structure 800 includes a fourth row 814 of VTFET 850, 852, 854, and 856 in parallel. In other words, each group of four VTFET in parallel include a shared input (source/drain region or contact region) and shared output (source/drain region or contact region). VTFET 820, 822, 824, 826, 830, 832, 834, 836, 840, 842, 844, 846, 850, 852, 854, and 856 are similar to VTFET structures described herein and include similar features. It should be noted, as stated above, semiconductor structure 800 represents a single structure and layout of VTFET circuitry and does not limit embodiments of the present invention to this structure and layout. In an embodiment, any other structure and layout of VTFET circuitry, including but not limited to other field-effect-transistors, may be included although not shown. It should be noted, for ease in discussion of FIG. 8, source/drain region contacts have not been included.

In an embodiment, the first row 802 of VTFET and third row 804 of VTFET include a first gate region 806. In an embodiment, the third row 812 of VTFET and fourth row 814 of VTFET include a second gate region 816. In an embodiment, the first gate region 806 and the second gate region 816 connected to a frontside or backside power delivery network (not shown). In an embodiment, the first row 802 of VTFET include a first top contact 864 electrically connected to the top source/drain regions (not shown) of each VTFET in the first row 802. In an embodiment, the second row 812 of VTFET include a second top contact 866 electrically connected to the top source/drain regions (not shown) of each VTFET in the second row 812. In an embodiment, the third row 804 of VTFET include a third top contact 860 electrically connected to the top source/drain regions (not shown) of each VTFET in the third row 804. In an embodiment, the fourth row 814 of VTFET include a fourth top contact 862 electrically connected to the top source/drain regions (not shown) of each VTFET in the fourth row 814. In an embodiment, the first top contact 864, second top contact 866, third top contact 860 and fourth top contact 862 are connected to a shared top contact 868. In an embodiment, the center of shared top contact 868 is 1 CPP distance from the center of fins of VTFET 826, 830, 846, and 850. In an embodiment, the shared top contact 868 is connected to a frontside or backside power delivery network (not shown).

Figure 9:
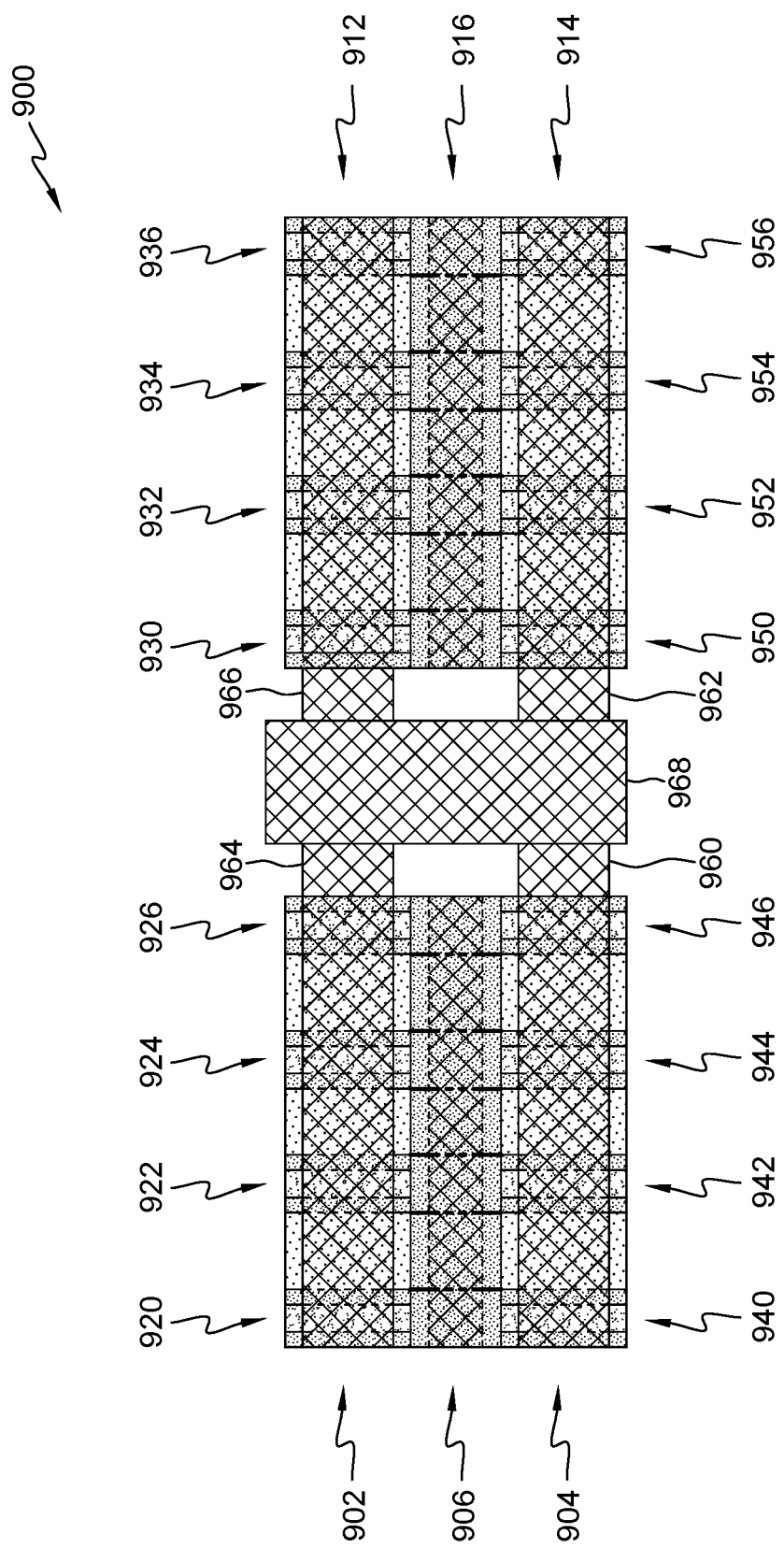
FIG. 9 depicts a top view of the semiconductor structure with a shared output region for multiple rows of semiconductor structures in accordance with a second embodiment of the present invention.

FIG. 9 depicts a top view of the semiconductor structure 900 with a shared output region for multiple rows of semiconductor structures 900 in accordance with a first embodiment of the present invention. As shown in FIG. 9, in an embodiment, semiconductor structure 900 includes a first row 902 of VTFET 920, 922, 924, and 926 in parallel. In an embodiment, semiconductor structure 900 includes a second row 912 of VTFET 930, 932, 934, and 936 in parallel. In an embodiment, semiconductor structure 900 includes a third row 904 of VTFET 940, 942, 944, and 946 in parallel. In an embodiment, semiconductor structure 900 includes a fourth row 914 of VTFET 950, 952, 954, and 956 in parallel. In other words, each group of four VTFET in parallel include a shared input (source/drain region or contact region) and shared output (source/drain region or contact region). VTFET 920, 922, 924, 926, 930, 932, 934, 936, 940, 942, 944, 946, 950, 952, 954, and 956 are similar to VTFET structures described herein and include similar features. It should be noted, as stated above, semiconductor structure 900 represents a single structure and layout of VTFET circuitry and does not limit embodiments of the present invention to this structure and layout. In an embodiment, any other structure and layout of VTFET circuitry, including but not limited to other field-effect-transistors, may be included although not shown. It should be noted, for ease in discussion of FIG. 9, source/drain region contacts have not been included.

In an embodiment, the first row 902 of VTFET and third row 904 of VTFET include a first gate region 906. In an embodiment, the third row 912 of VTFET and fourth row 914 of VTFET include a second gate region 916. In an embodiment, the first gate region 906 and the second gate region 916 connected to a frontside or backside power delivery network (not shown). In an embodiment, the first row 902 of VTFET include a first top contact 964 connected to the top source/drain regions (not shown) of each VTFET in the first row 902. In an embodiment, the second row 912 of VTFET include a second top contact 966 connected to the top source/drain regions (not shown) of each VTFET in the second row 912. In an embodiment, the third row 904 of VTFET include a third top contact 960 connected to the top source/drain regions (not shown) of each VTFET in the third row 904. In an embodiment, the fourth row 914 of VTFET include a fourth top contact 962 connected to the top source/drain regions (not shown) of each VTFET in the fourth row 914. In an embodiment, the first top contact 964, second top contact 966, third top contact 960 and fourth top contact 962 are connected to a shared top contact 868. In an embodiment, the center of shared top contact 968 is 2 CPP, allowing for a larger shared top contact 968 as compared to the embodiment discussed in reference to FIG. 8, distance from the center of fins of VTFET 926, 930, 946, and 950. In an embodiment, the shared top contact 968 is connected to a frontside or backside power delivery network (not shown).

Figure 10:
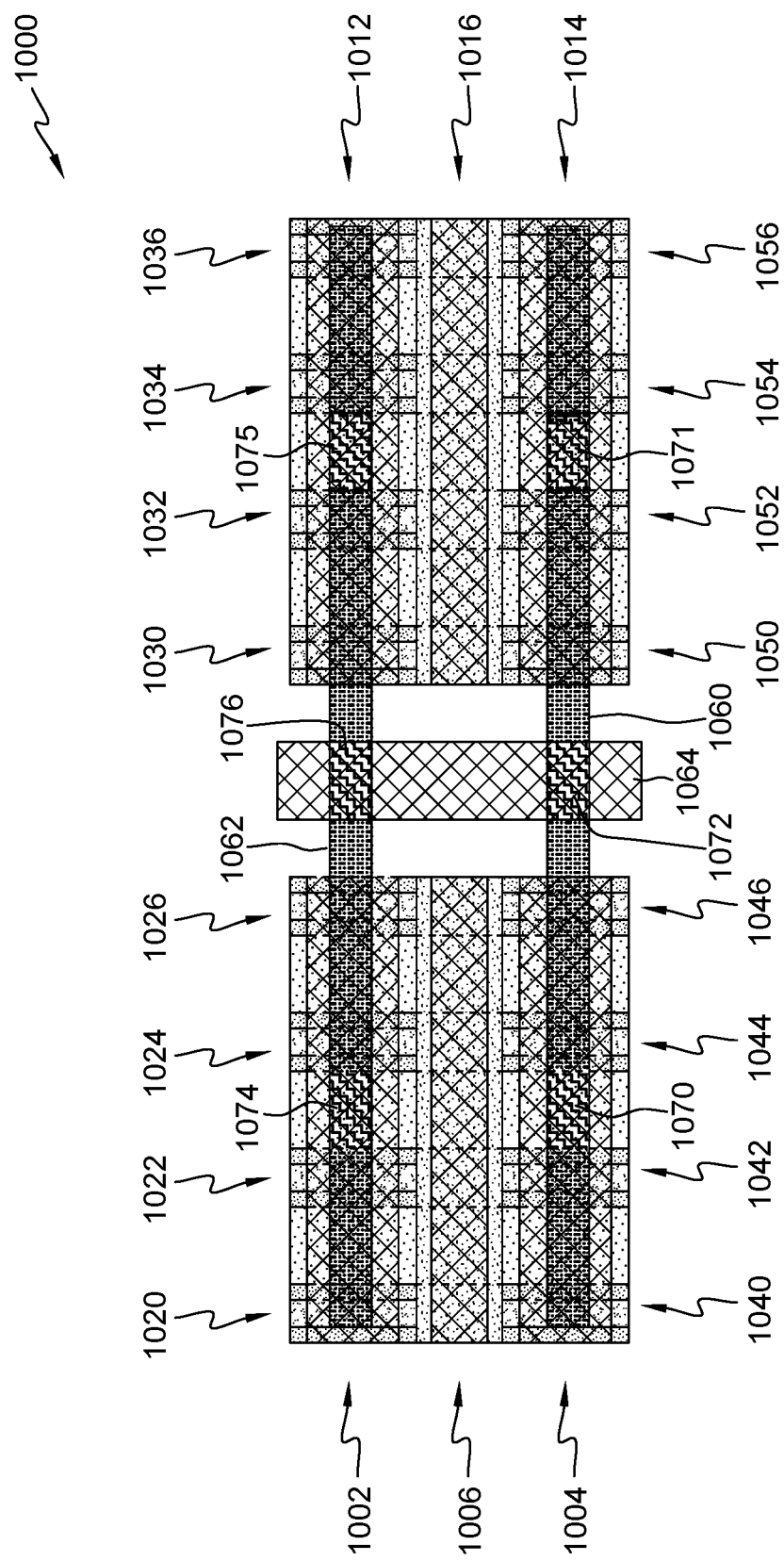
FIG. 10 depicts a top view of the semiconductor structure with a shared output region for multiple rows of semiconductor structures in accordance with a third embodiment of the present invention.

FIG. 10 depicts a top view of the semiconductor structure 1000 with a shared output region for multiple rows of semiconductor structures in accordance with a third embodiment of the present invention. As shown in FIG. 10, in an embodiment, semiconductor structure 1000 includes a first row 1002 of VTFET 1020, 1022, 1024, and 1026 in parallel. In an embodiment, semiconductor structure 1000 includes a second row 1012 of VTFET 1030, 1032, 1034, and 1036 in parallel. In an embodiment, semiconductor structure 1000 includes a third row 1004 of VTFET 1040, 1042, 1044, and 1046 in parallel. In an embodiment, semiconductor structure 1000 includes a fourth row 1014 of VTFET 1050, 1052, 1054, and 1056 in parallel. In other words, each group of four VTFET in parallel include a shared input (source/drain region or contact region) and shared output (source/drain region or contact region). VTFET 1020, 1022, 1024, 1026, 1030, 1032, 1034, 1036, 1040, 1042, 1044, 1046, 1050, 1052, 1054, and 1056 are similar to VTFET structures described herein and include similar features. It should be noted, as stated above, semiconductor structure 1000 represents a single structure and layout of VTFET circuitry and does not limit embodiments of the present invention to this structure and layout. In an embodiment, any other structure and layout of VTFET circuitry, including but not limited to other field-effect-transistors, may be included although not shown. It should be noted, for ease in discussion of FIG. 10, source/drain region contacts have not been included.

In an embodiment, the first row 1002 of VTFET and third row 1004 of VTFET include a first gate region 1006. In an embodiment, the third row 1012 of VTFET and fourth row 1014 of VTFET include a second gate region 1016. In an embodiment, the first gate region 1006 and the second gate region 1016 connect gate regions of VTFET 1020, 1022, 1024, 1026, 1030, 1032, 1034, 1036, 1040, 1042, 1044, 1046, 1050, 1052, 1054, and 1056 to a frontside or backside power delivery network (not shown). In an embodiment, the first row 1002 of VTFET include a first top contact connected to the top source/drain regions (not shown) of each VTFET in the first row 1002. In an embodiment, the second row 1012 of VTFET include a second top contact connected to the top source/drain regions (not shown) of each VTFET in the second row 1012. In an embodiment, the third row 1004 of VTFET include a third top contact connected to the top source/drain regions (not shown) of each VTFET in the third row 1004. In an embodiment, the fourth row 1014 of VTFET include a fourth top contact connected to the top source/drain regions (not shown) of each VTFET in the fourth row 1014.

In an embodiment, the first top contact is connected to a first metal layer 1062 by a first frontside metal layer contact 1074. As shown in FIG. 10, in an embodiment first frontside metal layer contact 1074 is square in shape. In alternative embodiment, first frontside metal layer contact 1074 may be circular, for example a via, or any other shape. In an embodiment, the second top contact is connected to a first metal layer 1062 by a second frontside metal layer contact 1075. As shown in FIG. 10, in an embodiment second frontside metal layer contact 1075 is square in shape. In alternative embodiment, second frontside metal layer contact 1075 may be circular, for example a via, or any other shape. In an embodiment, the third top contact is connected to a second metal layer 1060 by a third frontside metal layer contact 1070. As shown in FIG. 10, in an embodiment third frontside metal layer contact 1070 is square in shape. In alternative embodiment, third frontside metal layer contact 1070 may be circular, for example a via, or any other shape. In an embodiment, the fourth top contact is connected to a second metal layer 1060 by a fourth frontside metal layer contact 1071. As shown in FIG. 10, in an embodiment fourth frontside metal layer contact 1071 is square in shape. In alternative embodiment, fourth frontside metal layer contact 1071 may be circular, for example a via, or any other shape. In an embodiment, the first metal layer 1062 and the second metal layer 1060 are metal lines within the same vertical layer of metal above the contact layer.

In an embodiment, first metal layer 1062 is connected to shared top contact 1064 by first shared metal layer contact 1076. As shown in FIG. 10, in an embodiment first shared metal layer contact 1076 is square in shape. In alternative embodiment, first shared metal layer contact 1076 may be circular, for example a via, or any other shape. In an embodiment, second metal layer 1060 is connected to shared top contact 1064 by second shared metal layer contact 1072. As shown in FIG. 10, in an embodiment second shared metal layer contact 1072 is square in shape. In alternative embodiment, second shared metal layer contact 1072 may be circular, for example a via, or any other shape. In an embodiment, the center of shared top contact 1064 is 1 CPP distance from the center of fins of VTFET 1026, 1030, 1046, and 1050. In an embodiment, the shared top contact 1064 is connected to a frontside or backside power delivery network (not shown).

Figure 11:
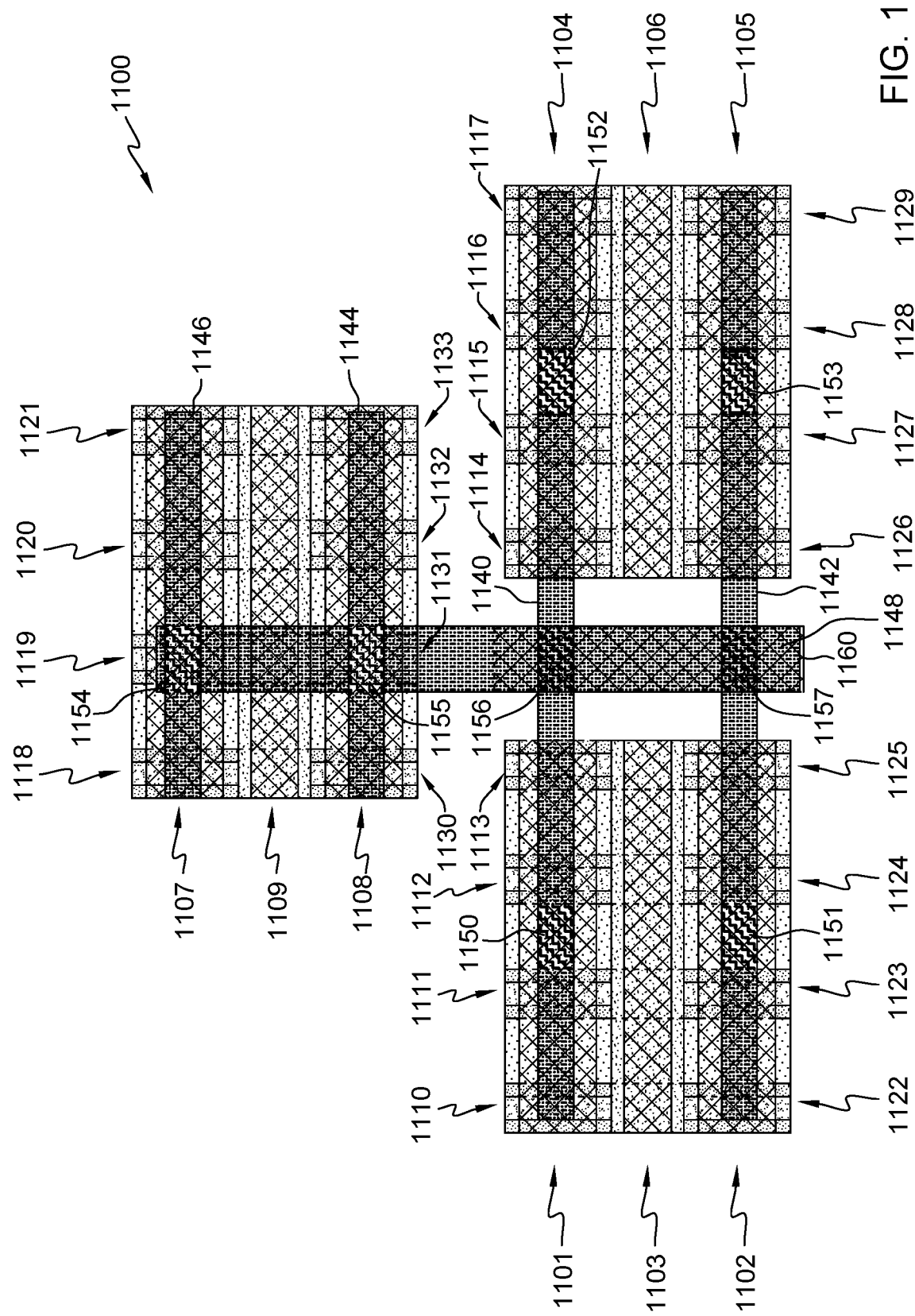
FIG. 11 depicts a top view of the semiconductor structure with a shared output region for multiple rows of semiconductor structures in accordance with a fourth embodiment of the present invention.

FIG. 11 depicts a top view of the semiconductor structure 1100 with a shared output region for multiple rows of semiconductor structures in accordance with a fourth embodiment of the present invention. As shown in FIG. 11, in an embodiment, semiconductor structure 1100 includes a first row 1101 of VTFET 1110, 1111, 1112, and 1113 in parallel. In an embodiment, semiconductor structure 1100 includes a second row 1102 of VTFET 1122, 1123, 1124, and 1125 in parallel. In an embodiment, semiconductor structure 1100 includes a third row 1104 of VTFET 1114, 1115, 1116, and 1117 in parallel. In an embodiment, semiconductor structure 1100 includes a fourth row 1105 of VTFET 1126, 1127, 1128, and 1129 in parallel. In an embodiment, semiconductor structure 1100 includes a fifth row 1107 of VTFET 1118, 1119, 1120, and 1121 in parallel. In an embodiment, semiconductor structure 1100 includes a sixth row 1108 of VTFET 1130, 1131, 1132, and 1133 in parallel. In other words, each group of four VTFET in parallel include a shared input (source/drain region or contact region) and shared output (source/drain region or contact region). VTFET 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, and 1133 are similar to VTFET structures described herein and include similar features. It should be noted, as stated above, semiconductor structure 1100 represents a single structure and layout of VTFET circuitry and does not limit embodiments of the present invention to this structure and layout. In an embodiment, any other structure and layout of VTFET circuitry, including but not limited to other field-effect-transistors, may be included although not shown. It should be noted, for ease in discussion of FIG. 11, source/drain region contacts have not been included.

In an embodiment, the first row 1101 of VTFET and second row 1102 of VTFET include a first gate region 1003. In an embodiment, the third row 1104 of VTFET and fourth row 1105 of VTFET include a second gate region 1106. In an embodiment, the fifth row 1107 of VTFET and sixth row 1108 of VTFET include a third gate region 1109. In an embodiment, the first gate region 1006, the second gate region 1016, and third gate region 1109 connect VTFET 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, and 1133 to a frontside or backside power delivery network (not shown). In an embodiment, the first row 1101 of VTFET include a first top contact connected to the top source/drain regions (not shown) of each VTFET in the first row 1101. In an embodiment, the second row 1102 of VTFET include a second top contact connected to the top source/drain regions (not shown) of each VTFET in the second row 1102. In an embodiment, the third row 1104 of VTFET include a third top contact connected to the top source/drain regions (not shown) of each VTFET in the third row 1104. In an embodiment, the fourth row 1105 of VTFET include a fourth top contact connected to the top source/ drain regions (not shown) of each VTFET in the fourth row 1105. In an embodiment, the fifth row 1107 of VTFET include a fifth top contact connected to the top source/drain regions (not shown) of each VTFET in the fifth row 1107. In an embodiment, the sixth row 1108 of VTFET include a sixth top contact connected to the top source/drain regions (not shown) of each VTFET in the sixth row 1108.

In an embodiment, the first top contact is connected to a first metal layer 1140 by a first frontside metal layer contact 1150. As shown in FIG. 11, in an embodiment first frontside metal layer contact 1150 is square in shape. In alternative embodiment, first frontside metal layer contact 1150 may be circular, for example a via, or any other shape. In an embodiment, the second top contact is connected to a second metal layer 1142 by a second frontside metal layer contact 1151. As shown in FIG. 11, in an embodiment second frontside metal layer contact 1151 is square in shape. In alternative embodiment, second frontside metal layer contact 1151 may be circular, for example a via, or any other shape. In an embodiment, the third top contact is connected to the first metal layer 1140 by a third frontside metal layer contact 1152. As shown in FIG. 11, in an embodiment third frontside metal layer contact 1152 is square in shape. In alternative embodiment, third frontside metal layer contact 1152 may be circular, for example a via, or any other shape. In an embodiment, the fourth top contact is connected to the second metal layer 1142 by a fourth frontside metal layer contact 1153. As shown in FIG. 10, in an embodiment fourth frontside metal layer contact 1153 is square in shape. In alternative embodiment, fourth frontside metal layer contact 1153 may be circular, for example a via, or any other shape. In an embodiment, the fifth top contact is connected to a third metal layer 1146 by a fifth frontside metal layer contact 1154. As shown in FIG. 11, in an embodiment fifth frontside metal layer contact 1154 is square in shape. In alternative embodiment, fifth frontside metal layer contact 1154 may be circular, for example a via, or any other shape. In an embodiment, the sixth top contact is connected to the fourth metal layer 1144 by a sixth frontside metal layer contact 1155. As shown in FIG. 11, in an embodiment sixth frontside metal layer contact 1155 is square in shape. In alternative embodiment, sixth frontside metal layer contact 1155 may be circular, for example a via, or any other shape. In an embodiment, the first metal layer 1140, the second metal layer 1142, third metal layer 1146 and fourth metal layer 1144 are on the same metal level. In an embodiment, the first metal layer 1140, second metal layer 1142, third metal layer 1146, and fourth metal layer 1144 are metal lines within the same vertical layer of metal above the contact layer.

In an embodiment, first metal layer 1140 is connected to shared bottom contact 1148 by bottom contact 1156. As shown in FIG. 11, in an embodiment bottom contact 1156 is square in shape. In alternative embodiment, first shared bottom contact 1156 may be circular, for example a via, or any other shape. In an embodiment, the center of shared bottom contact 1148 is 1 CPP distance from the center of fins of VTFET 1113, 1114. In an embodiment, the shared bottom contact 1148 is connected to a backside power delivery network (not shown). In an embodiment, second metal layer 1142 is connected to shared bottom contact 1148 by bottom contact 1157. As shown in FIG. 10, in an embodiment bottom contact 1157 is square in shape. In alternative embodiment, bottom contact 1157 may be circular, for example a via, or any other shape. In an embodiment, the center of shared bottom contact 1148 is 1 CPP distance from the center of fins of VTFET 1125, 1126. In an embodiment, the shared bottom contact 1148 connected to a backside power delivery network (not shown).

In an embodiment, third metal layer 1146 is connected to metal layer two 1160 by a contact (not shown). In an embodiment, the contact (not shown) may be at least partially within a vertical plane of fifth frontside metal layer contact 1154. In an embodiment, fourth metal layer 1144 is connected to metal layer two 1160 by a contact (not shown). In an embodiment, the contact (not shown) may be at least partially within a vertical plane of sixth frontside metal layer contact 1155. In an embodiment, metal layer two 1160 is on a metal layer above the metal layer of the first metal layer 1140, the second metal layer 1142, third metal layer 1146 and fourth metal layer 1144. In an embodiment, metal layer two 1160 is connected to first metal layer 1140 and/or second metal layer 1142 by a contact (not shown). In an embodiment, by connecting metal layer two 1160 to either first metal layer 1140 or second metal layer 1142, metal layer two 1160 is connected to shared bottom contact 1148. It should be noted, any number of contact configurations, as known in the art, may be used to connect metal layers above to metal layers below, including other metal contacts and/or lines on metal layers above and/or below what is shown for illustrative purposes.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor device comprising:
a vertical-transport field-effect transistor (VTFET);
a backside power delivery network separated from the VTFET by a first backside contact, wherein the first backside contact is connected to: (i) a bottom source/drain region of the VTFET and (ii) a first portion of the backside power delivery network;
a frontside contact, wherein the frontside contact is connected to a top source/drain region of the VTFET; and
a second backside contact, wherein the second backside contact is connected to: (i) the frontside contact and (ii) a second portion of the backside power delivery network.
2. The semiconductor device of claim 1, wherein:
the VTFET has a first width;
the first width is a contacted poly pitch (CPP); and
the second backside contact is at least the first width from the VTFET.
3. The semiconductor device of claim 1, wherein:
the VTFET has a first width;
the first width is a contacted poly pitch (CPP); and
the second backside contact is double the first width from the VTFET.
4. The semiconductor device of claim 1, wherein a height of the second backside contact is a height of a cell of the VTFET.
5. The semiconductor device of claim 1, wherein the first backside contact is connected to an active area layer.
6. The semiconductor device of claim 1, wherein the backside power delivery network is selected from the group consisting of; clock, power, and output signal.
7. A semiconductor device comprising:
a plurality of vertical-transport field-effect transistors (VTFETs);
a backside power delivery network separated from the plurality of VTFETs by a first backside contact, wherein the first backside contact is connected to; (i) a bottom source/drain region of each VTFET of the plurality of VTFET and (ii) a first portion of the backside power delivery network;
a frontside contact, wherein the frontside contact is connected to a top source/drain region of each VTFET of the plurality of VTFETs; and
a second backside contact, wherein the second backside contact is connected to: (i) the frontside contact and (ii) a second portion of the backside power delivery network.

8. The semiconductor device of claim 7, wherein:
each VTFET of the plurality of VTFETs has a first width;
the first width is a contacted poly pitch (CPP); and
the second backside contact is at least the first width from a first VTFET of the plurality of VTFETs.

9. The semiconductor device of claim 7, wherein:
each VTFET of the plurality of VTFETs has a first width;
the first width is a contacted poly pitch (CPP); and
the second backside contact is double the first width from a first VTFET of the plurality of VTFETs.

10. The semiconductor device of claim 7, wherein a height of the second backside contact is a height of a VTFET cell of the plurality of VTFETs.

11. The semiconductor device of claim 7, wherein the first backside contact is connected to an active area layer.

12. The semiconductor device of claim 7, wherein the backside power delivery network is selected from the group consisting of: clock, power, and output signal.

13. A semiconductor device comprising:
a first plurality of vertical-transport field-effect transistors (VTFETs) in a first row,
a second plurality of VTFETs in a second row, wherein the first row is vertically adjacent to the second row;
a backside power delivery network separated from the first plurality of VTFETs and the second plurality of VTFETs by a first backside contact, wherein the first backside contact is connected to: (i) a bottom source/drain region of each VTFET of the first plurality of VTFETs and (ii) a first portion of the backside power delivery network;
a first shared frontside contact above the first plurality of VTFETs, wherein the first shared frontside contact is connected to a top source/drain region of each VTFET of the first plurality of VTFETs;
a second shared frontside contact above the second plurality of VTFETs, wherein the second shared frontside contact is connected to a top source/drain region of each VTFET of the second plurality of VTFETs; and
a second backside contact, wherein the second backside contact is connected to: (i) the first shared frontside contact, the second shared frontside contact, and (iii) a second portion of the backside power delivery network.

14. The semiconductor device of claim 13, further comprising:
a second backside contact, wherein the second backside contact is connected to: (i) a bottom source/drain region of each VTFET of the second plurality of VTFETs and (ii) a third portion of the backside power delivery network.

15. The semiconductor device of claim 13, wherein the first backside contact is further connected to a bottom source/drain region of each VTFET of the second plurality of VTFETs.

16. The semiconductor device of claim 13, further comprising: wherein:
each VTFET of the first plurality of VTFETs and the second plurality of VTFETs has a first width;
the first width is a contacted poly pitch (CPP); and
the second backside contact is at least the first width from a first VTFET of the plurality of first plurality of VTFETs.

17. The semiconductor device of claim 13, wherein:
each VTFET of the first plurality of VTFETs and the second plurality of VTFETs has a first width;
the first width is a contacted poly pitch (CPP); and
the second backside contact is double the first width from a first VTFET of the first plurality of VTFETs.

18. The semiconductor device of claim 13, wherein the backside power delivery network is selected from the group consisting of; clock, power, and output signal.

19. The semiconductor device of claim 13, further comprising:
a first metal line in a first metal layer, wherein the first metal line is above the first shared frontside contact;
a second metal line in the first metal layer, wherein the second metal line is above the second shared frontside contact, wherein the first metal line and the second metal line connect to the backside power delivery network;
a first connection between the first metal line and the first shared frontside contact; and
a second connection between the second metal line and the second shared backside frontside contact.

* * * * *